US006949457B1

(12) United States Patent
Fiordalice et al.

(10) Patent No.: US 6,949,457 B1
(45) Date of Patent: Sep. 27, 2005

(54) BARRIER ENHANCEMENT

(75) Inventors: Robert W. Fiordalice, Austin, TX (US); Faivel Pintchovski, Austin, TX (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/761,540

(22) Filed: Jan. 21, 2004

(51) Int. Cl.$^7$ ............... H01L 21/4763; H01L 21/302; H01L 21/461
(52) U.S. Cl. ............... 438/627; 438/629; 438/631; 438/639; 438/643; 438/645; 438/648; 438/653; 438/656; 438/704; 438/745; 257/751; 257/758; 257/762; 257/764
(58) Field of Search .................. 438/622, 627, 438/629, 631, 639, 643, 645, 648, 653, 656, 438/704, 745; 257/751, 758, 762, 764

(56) References Cited

U.S. PATENT DOCUMENTS

| 2004/0241940 A1 * | 12/2004 | Lee et al. ............ 438/256 |
| 2005/0048767 A1 * | 3/2005 | Matsumoto ............ 438/629 |
| 2005/0074968 A1 * | 4/2005 | Chen et al. ............ 438/643 |

* cited by examiner

Primary Examiner—Ngân V. Ngô
(74) Attorney, Agent, or Firm—Luedeka, Neely & Graham, P.C.

(57) ABSTRACT

A method of forming an electrically conductive via. A first electrically conductive layer is formed, and a second layer is formed on the first layer. The second layer has desired barrier layer properties. A third non electrically conductive layer is formed on the second layer. A via hole is etched through the third layer, thereby exposing a portion of the second layer at the bottom of the via hole. The exposed portion of the second layer at the bottom of the via hole is redistributed so that at least a portion of the second layer is removed from the bottom of the via hole and deposited on lower portions of the sidewalls of the via hole. A fourth electrically conductive layer is formed within the via hole to form the electrically conductive via.

16 Claims, 1 Drawing Sheet

10

BARRIER ENHANCEMENT

FIELD

This invention relates to the field of integrated circuit fabrication. More particularly, this invention relates to increasing the effectiveness of barrier material formation in integrated circuit structures, such as high aspect ratio vias and contacts.

BACKGROUND

Integrated circuits are typically formed layer by layer on a substrate, such as on a monolithic semiconducting substrate formed of a group IV material such as germanium or silicon, or of a group III–V material such as gallium arsenide, or a combination of such materials. The layers are typically interleaved electrically conductive layers and non electrically conductive layers. Electrical conductivity between two or more electrically conductive layers is typically provided by an electrically conductive via that extends between the electrically conductive layers through one or more intervening non electrically conductive layer.

As integrated circuits have become increasingly smaller, structures such as the electrically conductive vias have also been reduced in size. Although there has also been somewhat of a reduction in the thickness of the non electrically conductive layers through which the vias pass, the reduction in the thickness of such layers has typically not been commensurate with the reduction in the diameter of the vias. Thus, vias tend to be changing in relative dimension, which is typically referred to as their aspect ratio. When the diameter of the via is relatively wide as compared to the depth of the via, then the aspect ratio of the via is relatively small or low. When the diameter of the via is relatively narrow as compared to the depth of the via, then the aspect ratio of the via is relatively large or high. Because the diameter of vias has generally been reduced at a rate that is larger than that by which the depth of the vias has been reduced, vias have generally been increasing in aspect ratio, or in other words, the vias of state of the art integrated circuit devices tend to have a higher aspect ratio than the vias of older integrated circuit designs.

The reduction in the size or geometry of the integrated circuits has also brought about many other changes in the processes, materials, and structures used to form them. For example, copper has substantially replaced aluminum as the predominant metal of choice for forming electrically conductive connections. Similarly, low k materials are quickly replacing traditional electrically insulating materials such as silicon dioxide as the material that is predominantly used for non electrically conductive layers. Although these relatively new materials have certain benefits which make them generally desirable for newer integrated circuit designs, they also have certain drawbacks or other issues associated with them.

For example, copper tends to readily diffuse into dielectric materials, such as low k materials and other non electrically conductive materials. Thus, when copper is used as a via plug material, a barrier material is typically used to line the sides of the via prior to depositing the copper plug. The barrier material provides a relatively impermeable barrier between the copper via and the non electrically conductive material in which the via is formed, so that the copper does not inter diffuse with the non electrically conductive material and create problems. For example, such inter diffusion can create shorts between adjacent vias or other electrically conductive structures, or can create open circuits if the non electrically conductive material diffuses into the via to a sufficient degree.

Unfortunately, as the aspect ratio of vias has increased, as described above, it has become increasingly difficult to properly form the barrier layer, particularly at the bottom of the vias. Thus, there is a concern that such vias, especially those with relatively higher aspect ratios, will have an inadequate barrier layer at the bottom of the via, and experience premature failures or other problems.

What is needed, therefore, is a method for producing vias, including relatively high aspect ratio vias, that provides enhanced barrier layer protection at the bottom of the via.

SUMMARY

The above and other needs are met by a method of forming an electrically conductive via. A first electrically conductive layer is formed, and a second layer is formed on the first layer. The second layer has desired barrier layer properties. A third non electrically conductive layer is formed on the second layer. A via hole is etched through the third layer, thereby exposing a portion of the second layer at the bottom of the via hole. The exposed portion of the second layer at the bottom of the via hole is redistributed so that at least a portion of the second layer is removed from the bottom of the via hole and deposited on lower portions of the sidewalls of the via hole. A fourth electrically conductive layer is formed within the via hole to form the electrically conductive via.

In this manner, the redistributed portion of the second layer that is exposed at the bottom of the via hole provides a good barrier between the fourth layer used for the via plug and the third layer used for the insulating material. The second layer is relatively easily redistributed in the bottom portions of the via hole, because it is already present at the bottom of the via hole. Such redistribution tends to be much easier than getting a barrier material down to the lower portions of the via hole after it has been formed. Thus, this method provides a via that tends to have improved barrier layer properties. In addition, because the barrier properties at the bottom of the via hole are improved, other barrier materials that may be used, such as tantalum nitride, do not need to be deposited as heavily. This tends to reduce the overall resistance of the via that is formed in this manner. Other benefits are also realized with the method as described.

In various embodiments of the invention, the first layer is formed of copper, the second layer is a cobalt tungsten phosphorous alloy, the third layer is a low k material, and the fourth layer is copper. In some embodiments the via and the via hole have aspect ratios that are at least two. In one embodiment, the steps of etching the via hole and redistributing the exposed portion of the second layer are accomplished with the same process. The step of etching the via hole may include one or more of a sputter etch, a wet etch, and a reactive ion etch. The step of redistributing the exposed portion of the second layer may be accomplished by sputtering the second layer with a gas, such as argon. In some embodiments, the step of redistributing the exposed portion of the second layer may include removing all of the second layer from the bottom of the via hole. Preferably, at least a fifth layer of an electrically conductive material is formed on the bottom and sidewalls of the via hole prior to the step of forming the fourth layer, where the fifth layer has desired barrier layer properties. A via and an integrated circuit formed by the methods given herein are also described.

According to another aspect of the invention, there is described an electrically conductive via for providing electrically continuity between a first electrically conductive layer and a second electrically conductive layer that are separated by a third non electrically conductive layer. The via includes an electrically conductive plug, and a fourth barrier material at the bottom and lower sidewalls of the via. A fifth barrier material may also be included on the bottom and sidewalls of the via.

According to yet another aspect of the invention, there is described an integrated circuit including an electrically conductive via for providing electrically continuity between a first electrically conductive layer and a second electrically conductive layer that are separated by a third non electrically conductive layer. The via includes an electrically conductive plug, and a fourth barrier material at the bottom and lower sidewalls of the via. A fifth barrier material may also be included on the bottom and sidewalls of the via.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
FIG. 1 is a cross sectional view of a portion of an integrated circuit, depicting a substrate and a first electrically conductive layer.

With reference now to FIG. 1, there is depicted a portion of an integrated circuit 10, including a substrate 12 and an overlying electrically conducting layer 14. The substrate 12 is preferably a monolithic semiconducting substrate 12, and is most preferably formed of silicon. Included in substrate 12 are preferably circuitry and other layers, which are known in the art, and which are not depicted in the figures so as to more fully draw the attention to the more important and novel aspects of the invention. The electrically conductive layer 14 is preferably formed of a metal or metal alloy, and is most preferably formed of copper. In one embodiment the electrically conductive layer 14 is an M1 layer, or in other words, the bottom most electrically interconnect layer.

Figure 2:
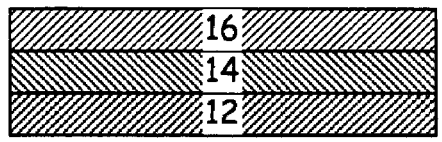
FIG. 2 is a cross sectional view of a portion of the integrated circuit of FIG. 1, additionally depicting a second barrier material layer.
Figure 3:
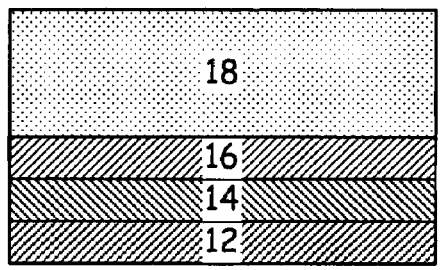
FIG. 3 is a cross sectional view of a portion of the integrated circuit of FIG. 2, additionally depicting a third non electrically conductive layer.

FIG. 2 depicts the structures of FIG. 1, where an overlying electrically conductive barrier layer 16 has been formed. The barrier layer 16 is preferably formed of a metal or metal alloy, and is most preferably formed of a cobalt tungsten alloy, such as cobalt tungsten phosphorous. FIG. 3 depicts the structures of FIG. 2, where a non electrically conductive layer 18 has been formed over the barrier layer 16. The non electrically conductive layer 18 is preferably formed of an electrically insulating material such as silicon oxide or silicon nitride, and is most preferably formed of a low k material.

Figure 4:
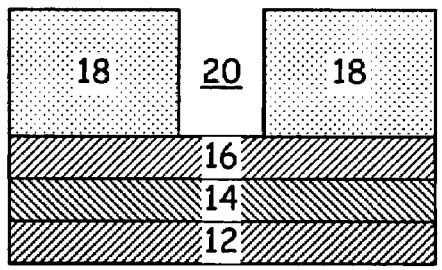
FIG. 4 is a cross sectional view of a portion of the integrated circuit of FIG. 3, additionally depicting a via hole etched in the third layer.

As depicted in FIG. 4, a via hole 20 has been formed in the non electrically conductive layer 18. As previously mentioned, the via hole 20 may be a high aspect ratio via hole 20, for which the present invention is particularly beneficial. However, the invention as described herein is also useful for via holes 20 which do not have a particularly high aspect ratio. Although generically described herein as a via hole, the structure 20 may in other embodiments be any other type of hole or aperture in which it is desired to provide a barrier against the sidewalls of the material in which the aperture is formed. The via hole 20 is preferably formed with an etching process, such as a sputter etch, a reactive ion etch, or a wet etch. Most preferably, a sputter etch is used to achieve a highly anisotropic etch, preferably yielding a via hole 20 with substantially vertical sidewalls.

Most preferably, the etching processes are stopped when all of the non electrically conductive material from the layer 18 has been removed from the via hole 20. In some embodiments, the materials of the layer 18 and the layer 16, and the etch processes used to etch the layer 18, are carefully selected so that the underlying layer 16 provides a highly selective etch stop to the etching processes used to etch the via hole 20 in the non electrically conductive layer 18.

Figure 5:
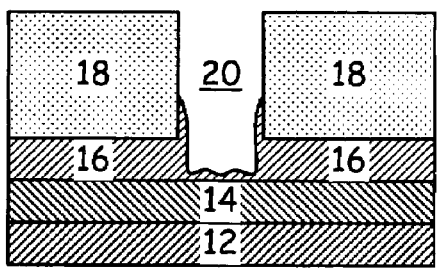
FIG. 5 is a cross sectional view of a portion of the integrated circuit of FIG. 4, additionally depicting redistributed portions of the exposed portions of the second layer at the bottom of the via hole, where some of the exposed portions of the second layer remain at the bottom of the via hole.
Figure 6:
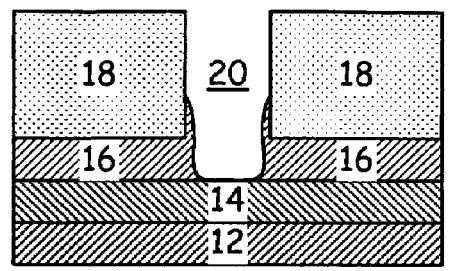
FIG. 6 is a cross sectional view of a portion of the integrated circuit of FIG. 4, additionally depicting redistributed portions of the exposed portions of the second layer at the bottom of the via hole, where all of the exposed portions of the second layer have been removed from the bottom of the via hole.

After etching the via hole 20 in the non electrically conductive layer 18, exposed material of the barrier layer 16 is preferably redistributed so as to at least partially remove material from the bottom of the via hole 20 are redeposit the partially removed material onto the lower sidewalls of the via hole 20, as depicted in FIG. 5. This process may either partially remove the barrier material 16 at the bottom of the via hole 20 as depicted in FIG. 5, or may alternately completely remove the barrier material 16 at the bottom of the via hole 20 as depicted in FIG. 6. Most preferably, the barrier material 16 is only partially removed, as depicted in FIG. 5. In this manner, there is no danger of contaminating the sidewalls of the via hole 20 with the material of the electrically conductive layer 14, which may have relatively high interdiffusion properties with the material of the non electrically conductive layer 18.

Preferably, an ion bombardment process of some type is used to redistribute the barrier material 16 from the bottom of the via hole 20 to the lower sidewalls of the via hole 20. This is most preferably accomplished such as by sputtering the structures with a material that is relatively inert to the exposed materials of the integrated circuit 10, such as argon. However, other gases could also be used, such as nitrogen, depending on the reactivity of such gases or other materials with the materials that have been selected for the fabrication of the integrated circuit 10 as described thus far. In one embodiment, the same etch process that is used to form the via hole 20 is used to redistribute the barrier material 16. Alternately, the etch process and the redistribution process may differ in specific processing conditions, but be conducted serially within the same processing chamber. In other embodiments, the etch process and the redistribution process are completely different processes that are accomplished at different times in different reaction chambers.

The barrier material 16 is preferably selected so as to have excellent barrier properties between the material that will eventually be used to substantially fill the via hole 20 and the non electrically conductive material 18. As previously mentioned, it is extremely difficult to get barrier materials down into the bottom portions of the via hole 20 after it has been formed, especially when the via hole 20 is a relatively high aspect ratio via hole 20. However, bombarding a layer at the bottom of a via hole 20 with ions, even a relatively high aspect ratio via hole 20, is relatively easy. Thus, it is not so difficult to redistribute the barrier material 16 along the lower sidewalls of the via hole 20.

It is appreciated that some of the barrier material 16 may be redeposited at the upper portions of the sidewalls of the via hole 20, and may even completely escape the via hole 20 during the redistribution process. However, the vast majority of the barrier material 16 tends to remain nearer the bottom portions of the via hole 20 during the redistribution process, for the same reason that it is difficult to deposit a barrier material down onto the lower sidewalls of the via hole 20 after it has already been formed, which reason is that it is difficult to move material along the length of the via hole 20, unless the via hole 20 is completely filled in the process. As it is generally undesirable to completely fill the via hole 20 with a barrier material, that processing option is generally discouraged.

Figure 7:
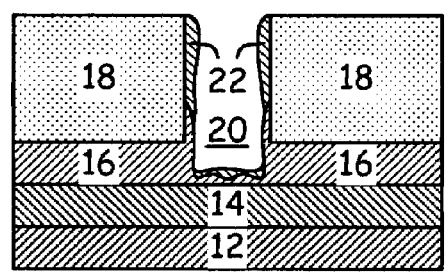
FIG. 7 is a cross sectional view of a portion of the integrated circuit of FIG. 5, additionally depicting a fifth barrier material layer.

Most preferably, an additional barrier material 22 is deposited within the via hole 20. The additional barrier material 22 tends to deposit mostly on the upper sidewall portions of the via hole 20, and somewhat at the very bottom of the via hole 20, as depicted in FIG. 7. If the barrier material 16 has been adequately redistributed on all portions of the sidewalls of the via hole 20, then the second barrier material 22 is not as necessary, and may optionally be omitted. However, for the considerations as described above, deposition of the second barrier material 22 is a preferred option. As mentioned above in regard to the barrier material 16, the properties of the second barrier material 22 are preferably selected so as to provide a good barrier between the non electrically conductive material 18 and the material that will be used to substantially fill the via hole 20.

Figure 8:
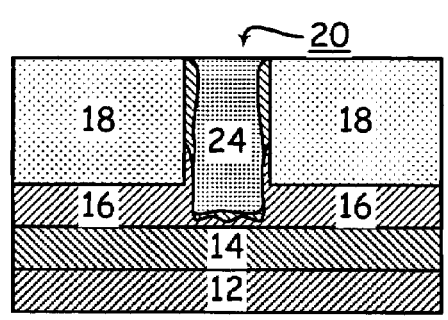
FIG. 8 is a cross sectional view of a portion of the integrated circuit of FIG. 7, additionally depicting a fourth electrically conductive layer.
Figure 9:
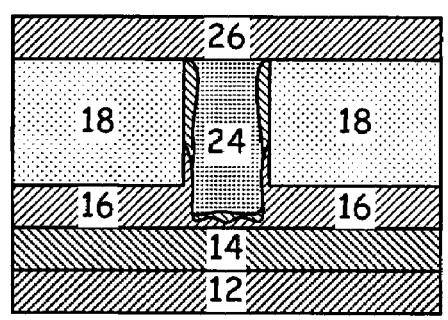
FIG. 9 is a cross sectional view of a portion of the integrated circuit of FIG. 8, additionally depicting a sixth electrically conductive layer.

FIG. 8 depicts the integrated circuit 10 after the via hole 20 has been filled with an electrically conductive plug material 24. The plug material 24 is preferably a metal or metal alloy, and is most preferably copper. FIG. 9 depicts the integrated circuit 10 with an overlying electrically conductive layer 26, such as an M2 layer, to continue the example as introduced above where the electrically conductive layer 14 is an M1 layer. The electrically conductive layer 26 is preferably formed of a metal or metal alloy, and is most preferably formed of copper.

The via structure as depicted in FIG. 9 is most preferably used in several different layers of the integrated circuit 10. Most preferably a barrier material of some kind is deposited both over and under each of the main electrically conductive layers such as layers 14 and 26, so as to provide a barrier between the electrically conductive layers and the non electrically conductive materials, such as material 18, which are deposited between such layers. It is noted that such an underlying barrier layer is not depicted under the electrically conductive layer 26 as depicted in FIG. 9, for the sake of simplicity in the figures.

Thus, there are described herein various processes, structures, and materials for use in integrated circuits, so as to more reliably provide an interdiffusion barrier between a via plug fill material and the materials in which the via hole is formed. The process as described also tends to produce a barrier layer 16 that is generally thinner at the bottom of the via hole, thus reducing to at least some degree the amount of electrical resistivity between the plug fill material 24 of the via and the underlying electrically conductive layer 14.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of forming an electrically conductive via, the method comprising the steps of:
   forming a first electrically conductive layer,
   forming a second layer on the first layer, the second layer having desired barrier layer properties,
   forming a third non electrically conductive layer on the second layer,
   etching a via hole through the third layer, the via hole having sidewalls and a bottom, thereby exposing a portion of the second layer at the bottom of the via hole,
   redistributing the exposed portion of the second layer at the bottom of the via hole so that at least a portion of the second layer is removed from the bottom of the via hole and deposited on lower portions of the sidewalls of the via hole, and
   forming a fourth electrically conductive layer within the via hole to form the electrically conductive via.

2. The method of claim 1, wherein the first layer is formed of copper.

3. The method of claim 1, wherein the second layer is a cobalt tungsten phosphorous alloy.

4. The method of claim 1, wherein the third layer is a low k material.

5. The method of claim 1, wherein the fourth layer is copper.

6. The method of claim 1, wherein the via and the via hole have aspect ratios that are at least two.

7. The method of claim 1, wherein the steps of etching the via hole and redistributing the exposed portion of the second layer are accomplished with the same process.

8. The method of claim 1, wherein the step of etching the via hole comprises a sputter etch.

9. The method of claim 1, wherein the step of etching the via hole comprises a wet etch.

10. The method of claim 1, wherein the step of etching the via hole comprises a reactive ion etch.

11. The method of claim 1, wherein the step of redistributing the exposed portion of the second layer comprises sputtering the second layer with a gas.

12. The method of claim 1, wherein the step of redistributing the exposed portion of the second layer comprises sputtering the second layer with argon.

13. The method of claim 1, wherein the step of redistributing the exposed portion of the second layer further comprises removing all of the second layer from the bottom of the via hole.

14. The method of claim 1, further comprising the step of forming a fifth layer of an electrically conductive material on the bottom and sidewalls of the via hole prior to the step of forming the fourth layer, where the fifth layer has desired barrier layer properties.

15. A via formed by the method of claim 1.

16. An integrated circuit, the improvement comprising a via formed by the method of claim 1.

* * * * *